(12) United States Patent
Zhang et al.

(10) Patent No.: US 9,910,230 B2
(45) Date of Patent: Mar. 6, 2018

(54) INTEGRALLY FORMED COUPLING MODULE

(71) Applicant: HUAWEI TECHNOLOGIES CO., LTD., Shenzhen, Guangdong (CN)

(72) Inventors: Yuanliang Zhang, Wuhan (CN); Chuang Zhou, Greenwood Village, CO (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/378,550

(22) Filed: Dec. 14, 2016

(65) Prior Publication Data

US 2017/0168250 A1    Jun. 15, 2017

(30) Foreign Application Priority Data

Dec. 15, 2015 (CN) .......................... 2015 1 0937507

(51) Int. Cl.
*G02B 6/42* (2006.01)
*H01S 5/022* (2006.01)
(Continued)

(52) U.S. Cl.
CPC ......... *G02B 6/4214* (2013.01); *G02B 6/4206* (2013.01); *G02B 6/4286* (2013.01); *H01S 5/02284* (2013.01); *G02B 6/30* (2013.01); *G02B 6/32* (2013.01); *G02B 6/428* (2013.01); *G02B 6/4213* (2013.01); *H01S 5/02236* (2013.01); *H01S 5/02292* (2013.01);
(Continued)

(58) Field of Classification Search
None
See application file for complete search history.

(56) References Cited

U.S. PATENT DOCUMENTS 6,888,988 B2   5/2005   Vancoille et al.
6,959,133 B2   10/2005  Vancoill et al.
(Continued)

FOREIGN PATENT DOCUMENTS

EP    1606664    7/2010
GB    2310507    8/1997

OTHER PUBLICATIONS

Extended European Search Report, dated May 11, 2017, in European Application No. 16203562.0 (9 pp.).

*Primary Examiner* — Jerry Rahll
(74) *Attorney, Agent, or Firm* — Staas & Halsey LLP

(57) ABSTRACT

An integrally formed coupling module is provided. In the module, a total internal reflective surface reflects a first optical signal emitted by a laser to form a second optical signal, the second optical signal is output to the medium air interface, a medium air interface refracts the second optical signal to form a third optical signal, the third optical signal is output from air to the air medium interface, an air medium interface refracts the third optical signal to form a fourth optical signal, and then the fourth optical signal is output to an optical fiber. In addition, a refractive angle at which the medium air interface performs refraction to form the third optical signal is equal to an incidence angle at which the third optical signal is output to the air medium interface, and a first incident surface and a second incident surface are mutually perpendicular in space.

15 Claims, 4 Drawing Sheets

(51) Int. Cl.
  *G02B 6/32* (2006.01)
  *G02B 6/30* (2006.01)
  *H04B 10/50* (2013.01)
  *H01S 5/0683* (2006.01)
  *H01S 5/183* (2006.01)

(52) U.S. Cl.
  CPC ............ *H01S 5/0683* (2013.01); *H01S 5/183* (2013.01); *H04B 10/503* (2013.01)

(56) References Cited

U.S. PATENT DOCUMENTS

| | | | | |
|---|---|---|---|---|
| 7,556,440 | B2* | 7/2009 | Birincioglu | G02B 6/4206 385/33 |
| 8,503,838 | B2* | 8/2013 | Chen | H04B 10/564 385/31 |
| 8,676,006 | B2* | 3/2014 | Morioka | G02B 6/4214 385/14 |
| 9,195,017 | B2* | 11/2015 | Liao | G02B 6/4286 |
| 9,323,013 | B2* | 4/2016 | Shao | G02B 6/4246 |
| 9,429,725 | B2* | 8/2016 | Shao | H04B 10/40 |
| 9,529,164 | B1* | 12/2016 | Cheng | G02B 6/4214 |

\* cited by examiner

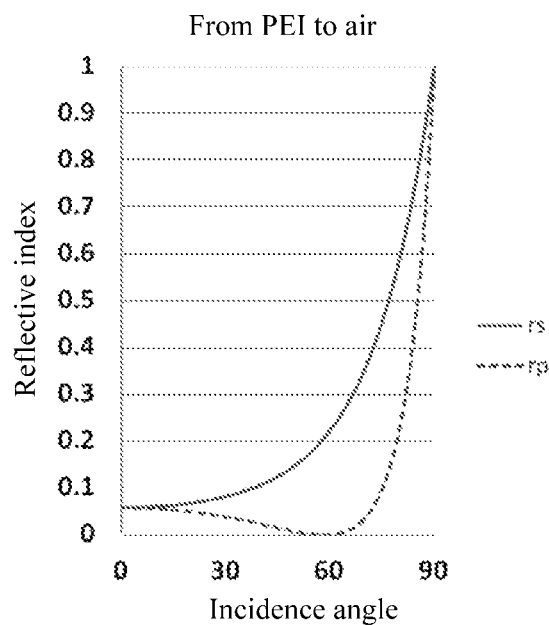
FIG. 4-a
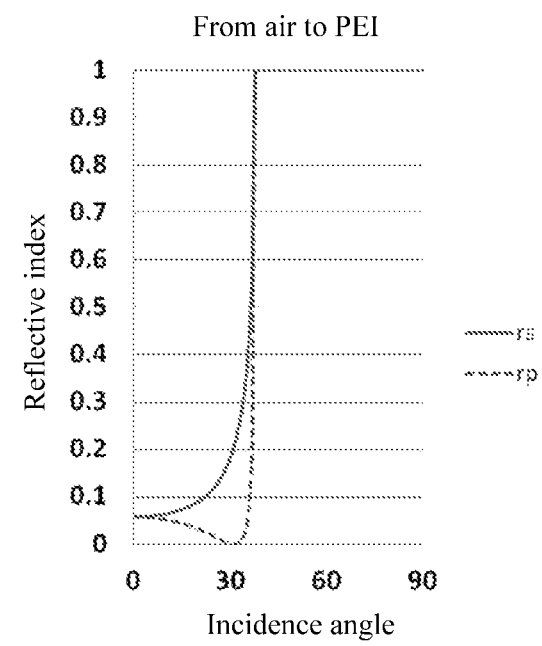
FIG. 4-b

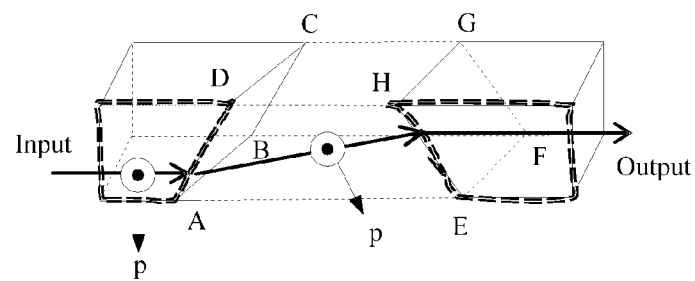
FIG. 5-a
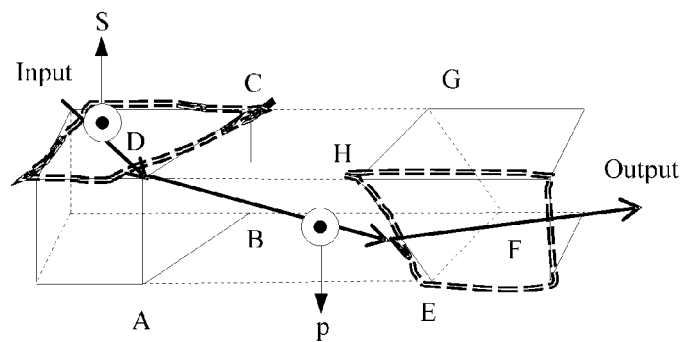
FIG. 5-b
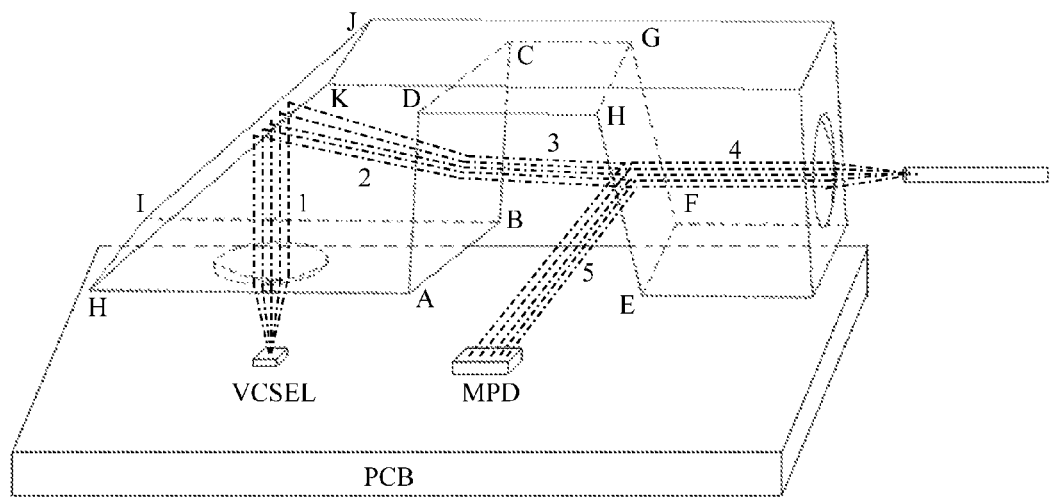
FIG. 6

INTEGRALLY FORMED COUPLING MODULE

CROSS-REFERENCE TO RELATED APPLICATION

This application claims priority to Chinese Patent Application No. 201510937507.4, filed on Dec. 15, 2015, which is hereby incorporated by reference in its entirety.

TECHNICAL FIELD

The present invention relates to the field of optical communications technologies, and in particular, to an integrally formed coupling module.

BACKGROUND

A multi-mode fiber optic link using a vertical cavity surface emitting laser (VCSEL) is a key component for short-distance interconnection between a server and a high-performance computer node in a data center and a storage network. With increase of services provided in the Internet and users, a scale of a data center and data traffic therein also increase, and there are development requirements for a high data transmission rate, a long transmission link, and a low-cost optical link network. This imposes a higher requirement on stability of a VCSEL as a light source and light source quality (that is, low-noise performance). Meanwhile, a VCSEL-based optical module packaging manner with lower costs is more welcome in the market.

Magnitude of output optical power of a VCSEL changes with increase in temperature and using duration. A method for stabilizing output optical power of a VCSEL is: taking a part of the output optical power for monitoring, and dynamically controlling a bias current of the VCSEL by using a closed-loop feedback circuit, to stabilize the output optical power.

An output spectrum of the VCSEL presents multi-mode and dual-polarization component characteristics. A mode selection structure, a structure that destroys mode field integrity, and a polarization-sensitive structure all destroy integrity of the output spectrum of the VCSEL. If any one of the foregoing structures exists in an optical path, noise of an optical signal is increased. Especially, when the VCSEL is in high-speed dynamic modulation, increased noise greatly limits a modulation rate and a transmission link length.

An integrally formed coupling module made of a polymer is used to replace a traditional Transistor Outline (TO) structure, which not only can omit multiple discrete components but also can simplify a coupling manufacturing process. Therefore, costs are greatly lowered. As shown in FIG. 1, FIG. 1 is a schematic diagram of a process of implementing optical power monitoring in an integrally formed coupling module in the prior art, and the integrally formed coupling module in the prior art includes: a surface HIJK, a surface ABCD, and a surface EFGH. An incident surface of the surface ABCD is parallel to an incident surface of the surface EFGH, and the surface ABCD and the surface EFGH form an air gap. In FIG. 1, an optical signal emitted from a laser is represented by an arrowed line segment; the optical signal is reflected on the surface HIJK to form an optical signal 2; a part of the optical signal 2 is reflected on the surface ABCD to form an optical signal 3; the optical signal 3 may be used to monitor power; the other part of the optical signal 2 is transmitted through the interface ABCD to form an optical signal 4; the optical signal 4 is refracted on the surface EFGH to form an optical signal 5 and propagation continues; then the optical signal 5 is propagated to an optical fiber and is output. In the integrally formed coupling module, a medium air interface and an air medium interface forming an air gap reflects and refracts light, so that multiple beams of light (for example, the optical signal 3 and the optical signal 5 in FIG. 1) may be formed. Because optical power of the two beams of light is in a fixed proportion, if the optical power of the optical signal 3 is known, the optical power of the optical signal 5 can be determined.

In a process of implementing the present invention, it is found that, in the prior art shown in FIG. 1, light reflection and refraction of a structure system formed by the medium air interface and the air medium interface are polarization-sensitive. In the prior art, the air gap is formed in an integral polymer structure, and then two extra surfaces: the surface ABCD and the surface EFGH are formed in a light propagation direction. The surface ABCD introduces polarized noise a into the optical signal 2 passing through the surface ABCD, and then polarized noise of the optical signal 4 is greater than polarized noise of the optical signal 2. The surface EFGH also introduces polarized noise b into the optical signal 4 passing through the surface EFGH. Because the surface ABCD and the surface EFGH that form the air gap are respectively parallel to incident surfaces formed by the optical signal 2 and the optical signal 4, directions of the polarized noise a and the polarized noise b are the same. For the optical signal 5, with respect to the optical signal 4, the introduced polarized noise b is enhanced and superposed based on the polarized noise a. Therefore, polarized noise of the optical signal 5 is greater than the polarized noise of the optical signal 4. A final result is that the polarized noise of the optical signal 5 is greater than the polarized noise of the optical signal 4, and the noise of the optical signal 4 is greater than the noise of the optical signal 2. Therefore, the medium air interface included in the integrally formed coupling module in the prior art accumulates polarization relevant characteristics of an optical signal that passes through the medium air interface. That is, the medium air interface and the air medium interface in the prior art form a polarization-sensitive structure. When the polarization-sensitive structure exists in a VCSEL optical path, noise of an optical signal increases, which limits a data transmission rate of a link and a transmission link length.

SUMMARY

Embodiments of the present invention provide an integrally formed coupling module, to offset polarized noise introduced by a medium air interface and an air medium interface, so that the integrally formed coupling module has no polarization-sensitive characteristic.

To resolve the foregoing technical problem, the following technical solutions are provided in the embodiments of the present invention:

An embodiment of the present invention provides an integrally formed coupling module, including: a total internal reflective surface, a medium air interface, and an air medium interface, where the total internal reflective surface first reflects a first optical signal emitted by a laser to form a second optical signal, the second optical signal is output to the medium air interface, the medium air interface may refract the second optical signal to form a third optical signal, the third optical signal is output from air to the air medium interface, next, the air medium interface may refract the third optical signal to form a fourth optical signal, and then the fourth optical signal is output to an optical fiber. In this embodiment of the present invention, spatial locations of the total internal reflective surface, the medium air interface, and the air medium interface satisfy the following relationship: a refractive angle at which the medium air interface performs refraction to form the third optical signal is equal to an incidence angle at which the third optical signal is output to the air medium interface, and a first incident surface and a second incident surface are mutually perpendicular in space. The first incident surface is an incident surface formed by the second optical signal output to the medium air interface and a normal of the medium air interface, and the second incident surface is an incident surface formed by the third optical signal output to the air medium interface and a normal of the air medium interface.

In the foregoing embodiment of the present invention, because the first incident surface corresponding to the medium air interface and the second incident surface corresponding to the air medium interface are mutually perpendicular in space, a direction of polarized noise introduced by the medium air interface is opposite to that of polarized noise introduced by the air medium interface. Besides, in this embodiment of the present invention, the refractive angle at which the medium air interface performs refraction to form the third optical signal is equal to the incidence angle at which the third optical signal is output to the air medium interface. In this way, the polarized noise introduced by the medium air interface can completely offset the polarized noise introduced by the air medium interface, so that no polarized noise is introduced into the optical signal after the optical signal passes through the medium air interface and the air medium interface in the integrally formed coupling module provided in this embodiment of the present invention. In this embodiment of the present invention, the medium air interface and the air medium interface form a polarization-insensitive structure. Therefore, the integrally formed coupling module provided in this embodiment of the present invention has a higher data transmission rate and a longer transmission link length when transmitting an optical signal on a transmission link.

With reference to the first aspect, in a first possible implementation manner of the first aspect, the medium air interface may further reflect the second optical signal, to form a fifth optical signal; and the fifth optical signal is output to an optical monitor, and the optical monitor monitors, according to the fifth optical signal, optical signal power at which the laser emits the first optical signal.

In the foregoing embodiment of the present invention, because the integrally formed coupling module provided in this embodiment of the present invention has no polarization-sensitive characteristic, a ratio of optical power of the fifth optical signal reflected from the medium air interface to optical power of the third optical signal refracted from the medium air interface is fixed. For example, a ratio relationship is 5%:95%. If the optical monitor obtains that power of light that accounts for the part of 5% is a, power of light that accounts for the part of 95% is (95/5)a=19a.

With reference to the first aspect, in a second possible implementation manner of the first aspect, the air medium interface may further reflect the third optical signal, to form a sixth optical signal; and the sixth optical signal is output to an optical monitor, and the optical monitor monitors, according to the sixth optical signal, optical signal power at which the laser emits the first optical signal.

In the foregoing embodiment of the present invention, because the integrally formed coupling module provided in this embodiment of the present invention has no polarization-sensitive characteristic, a ratio of optical power of the sixth optical signal reflected from the air medium interface to optical power of the fourth optical signal refracted from the air medium interface is fixed. For example, a ratio relationship is 5%:95%. If the optical monitor obtains that power of light that accounts for the part of 5% is a, power of light that accounts for the part of 95% is (95/5)a=19a.

With reference to the first aspect or the first possible or second possible implementation manner of the first aspect, in a third possible implementation manner of the first aspect, the laser and/or the optical monitor may be surface-mounted on a printed circuit board PCB.

In the foregoing embodiment of the present invention, the laser and/or the optical monitor may be disposed on a PCB by using a surface-mounting process, and locations of the laser and the optical monitor are fixed, which facilitates optical signal emission and optical power monitoring.

With reference to the first aspect or the first possible or second possible implementation manner of the first aspect, in a fourth possible implementation manner of the first aspect, the integrally formed coupling module further includes: a collimation lens, where the collimation lens may collimate the first optical signal emitted by the laser and output the collimated first optical signal to the total internal reflective surface.

In the foregoing embodiment of the present invention, the optical signal emitted by the laser may be collimated by using the collimation lens in the integrally formed coupling module, so that the first optical signal is straightly output to the total internal reflective surface.

With reference to the first aspect or the first possible or second possible implementation manner of the first aspect, in a fifth possible implementation manner of the first aspect, the integrally formed coupling module further includes: a convergence lens, where the convergence lens is configured to converge the fourth optical signal formed after the air medium interface performs refraction and output the converged fourth optical signal to the optical fiber.

In the foregoing embodiment of the present invention, the optical signal emitted from an air gap may be converged by using the convergence lens in the integrally formed coupling module, so that the fourth optical signal can be output to the optical fiber in a more concentrated manner.

With reference to the first aspect or the first possible or second possible implementation manner of the first aspect, in a sixth possible implementation manner of the first aspect, a material used for the integrally formed coupling module is a high temperature resistant polymer, for example, PEI.

In the foregoing embodiment of the present invention, the integrally formed coupling module may be implemented by using a high temperature resistant polymer material, which has low production costs, has a broad range in production materials, and is easy to process and implement.

With reference to the first aspect or the first possible or second possible implementation manner of the first aspect, in a seventh possible implementation manner of the first aspect, the optical fiber is a multi-mode fiber or a single-mode fiber.

In the foregoing embodiment of the present invention, the integrally formed coupling module provided in this embodiment of the present invention has no polarization-sensitive characteristic, and the optical signal emitted through the integrally formed coupling module may be transmitted by a multi-mode fiber or a single-mode fiber. Therefore, the integrally formed coupling module provided in this embodiment of the present invention is applicable to long-distance transmission or short-distance transmission of an optical signal.

With reference to the first aspect or the first possible or second possible implementation manner of the first aspect, in an eighth possible implementation manner of the first aspect, the integrally formed coupling module and the optical fiber are in a same horizontal direction, and the first optical signal emitted by the laser is vertically output to the total internal reflective surface.

In the foregoing embodiment of the present invention, when the integrally formed coupling module and the optical fiber are in a same horizontal direction, the optical signal output by the integrally formed coupling module may be output to the optical fiber along a horizontal direction, so that the optical signal emitted by the laser can still be output to the optical fiber after passing through the integrally formed coupling module, and is transmitted to the outside by the optical fiber.

With reference to the first aspect or the first possible or second possible implementation manner of the first aspect, in a ninth possible implementation manner of the first aspect, the optical monitor is specifically a monitor photodiode MPD, and the laser is specifically a vertical cavity surface-emitting laser VCSEL or a distributed feedback laser DFB.

BRIEF DESCRIPTION OF DRAWINGS

To describe the technical solutions in the prior art and the embodiments of the present invention more clearly, the following briefly describes the accompanying drawings required for describing the prior art and the embodiments. Apparently, the accompanying drawings in the following description show merely some embodiments of the present invention, and a person skilled in the art may still derive other drawings from these accompanying drawings.

FIG. 4-a is a schematic diagram of a process in which reflection coefficients of an s component and a p component of incident light change with an incidence angle on an interface according to an embodiment of the present invention;

FIG. 4-b is a schematic diagram of another process in which reflection coefficients of an s component and a p component of incident light change with an incidence angle on an interface according to an embodiment of the present invention;

FIG. 5-a is a schematic diagram of optical signal transmission analysis in an integrally formed coupling module in the prior art according to an embodiment of the present invention;

FIG. 5-b is a schematic diagram of optical signal transmission analysis in an integrally formed coupling module according to an embodiment of the present invention;

FIG. 6 is a three-dimensional structural diagram of an integrally formed coupling module according to an embodiment of the present invention;

DESCRIPTION OF EMBODIMENTS

Embodiments of the present invention provide an integrally formed coupling module, to offset polarized noise introduced by a medium air interface and an air medium interface, so that the integrally formed coupling module has no polarization-sensitive characteristic.

To make the invention objectives, features, and advantages of the present invention clearer and more comprehensible, the following clearly describes the technical solutions in the embodiments of the present invention with reference to the accompanying drawings in the embodiments of the present invention. Apparently, the embodiments described in the following are merely a part rather than all of the embodiments of the present invention. All other embodiments obtained by a person skilled in the art based on the embodiments of the present invention shall fall within the protection scope of the present invention.

In the specification, claims, and accompanying drawings of the present invention, the terms "first", "second", and so on are intended to distinguish between similar objects but do not necessarily indicate a specific order or sequence. It should be understood that the terms used in such a way are interchangeable in proper circumstances, which is merely a discrimination manner that is used when objects having a same attribute are described in the embodiments of the present invention. In addition, the terms "include", "contain" and any other variants mean to cover the non-exclusive inclusion, so that a process, method, system, product, or device that includes a series of units is not necessarily limited to those units, but may include other units not expressly listed or inherent to such a process, method, system, product, or device.

Detailed descriptions are separately provided in the following.

Figure 2:
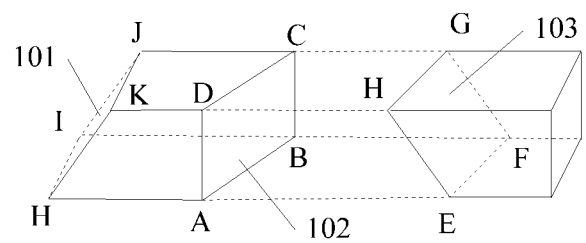
FIG. 2 is a schematic structural diagram of composition of an integrally formed coupling module according to an embodiment of the present invention.

The integrally formed coupling module provided in the embodiments of the present invention may be configured to transmit an optical signal. Refer to FIG. 2. An integrally formed coupling module provided in an embodiment of the present invention includes: a total internal reflective (TIR) surface 101, a medium air interface 102, and an air medium interface 103, where the total internal reflective surface 101 is configured to reflect a first optical signal emitted by a laser to form a second optical signal, and the second optical signal is output to the medium air interface 102;

the medium air interface 102 is configured to refract the second optical signal to form a third optical signal, and the third optical signal is output from air to the air medium interface 103;

the air medium interface 103 is configured to refract the third optical signal to form a fourth optical signal, and the fourth optical signal is output to an optical fiber; and spatial locations of the total internal reflective surface 101, the medium air interface 102, and the air medium interface 103 satisfy the following relationship: a refractive angle at which the medium air interface 102 performs refraction to form the third optical signal is equal to an incidence angle at which the third optical signal is output to the air medium interface 103, and a first incident surface and a second incident surface are mutually perpendicular in space, where the first incident surface is an incident surface formed by the second optical signal output to the medium air interface 102 and a normal of the medium air interface 102, and the second incident surface is an incident surface formed by the third optical signal output to the air medium interface 103 and a normal of the air medium interface 103.

In this embodiment of the present invention, as shown in FIG. 2, a surface HIJK is the total internal reflective surface 101, a surface ABCD is the medium air interface 102, a surface EFGH is the air medium interface 103, and the surface ABCD and the surface EFGH form an air gap. However, in this embodiment of the present invention, the refractive angle at which the medium air interface 102 performs refraction to form the third optical signal is equal to the incidence angle at which the third optical signal is output to the air medium interface 103, and the first incident surface and the second incident surface are mutually perpendicular in space. Because the first incident surface corresponding to the medium air interface and the second incident surface corresponding to the air medium interface are mutually perpendicular in space, a direction of polarized noise introduced by the medium air interface is opposite to that of polarized noise introduced by the air medium interface. Besides, in this embodiment of the present invention, the refractive angle at which the medium air interface performs refraction to form the third optical signal is equal to the incidence angle at which the third optical signal is output to the air medium interface. In this way, the polarized noise introduced by the medium air interface can completely offset the polarized noise introduced by the air medium interface, so that no polarized noise is introduced into the optical signal after the optical signal passes through the medium air interface and the air medium interface in the integrally formed coupling module provided in this embodiment of the present invention. In this embodiment of the present invention, the medium air interface and the air medium interface form a polarization-insensitive structure. Therefore, the integrally formed coupling module provided in this embodiment of the present invention has a higher data transmission rate and a longer transmission link length when transmitting an optical signal on a transmission link.

Figure 1:
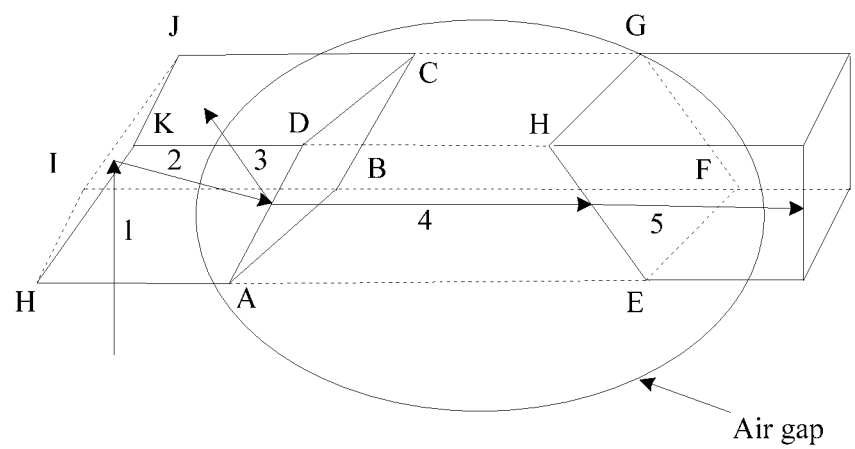
FIG. 1 is a schematic diagram of a process of implementing optical power monitoring in an integrally formed coupling module in the prior art.

In this embodiment of the present invention, in order not to destroy a mode field structure of an optical signal, the medium air interface and the air medium interface are used to form the integrally formed coupling module. In this embodiment of the present invention, relative spatial locations of the medium air interface and the air medium interface at two ends of the air gap need to be specially adjusted. In the prior art shown in FIG. 1, the medium air interface and the air medium interface at the two ends of the air gap are respectively a surface ABCD and a surface EFGH. The two surfaces are both perpendicular to a paper surface (that is, a surface AEHD), but each have an angle of non-90 degrees with a surface CDHG. In this embodiment of the present invention, a feasible implementation manner is keeping the surface EFGH unchanged and adjusting the surface ABCD, that is, the surface EFGH is still perpendicular to the surface AEHD, and the surface EFGH and the surface CDHG have an angle of non-90 degrees. In this embodiment of the present invention, the surface ABCD and the surface CDHG may be adjusted to be mutually perpendicular in space, so that the surface ABCD and the surface AEHD have an angle of non-90 degrees. In addition, in this embodiment of the present invention, the total internal reflective surface HIJK needs to be adjusted correspondingly, so that after an optical signal reflected from the surface HIJK is output to the surface ABCD, a refractive angle at which the surface ABCD refracts the optical signal is the same as an incidence angle at which an optical signal is output to the surface EFGH.

It should be noted that the integrally formed coupling module shown in FIG. 2 is only a schematic diagram of an implementation manner for ensuring that the first incident surface and the second incident surface are mutually perpendicular in space. In actual application, to enable that the first incident surface and the second incident surface are mutually perpendicular in space, a manner for setting relative locations of the surface ABCD and the surface EFGH may not be limited to FIG. 2. FIG. 2 is intended only for description.

Figure 3:
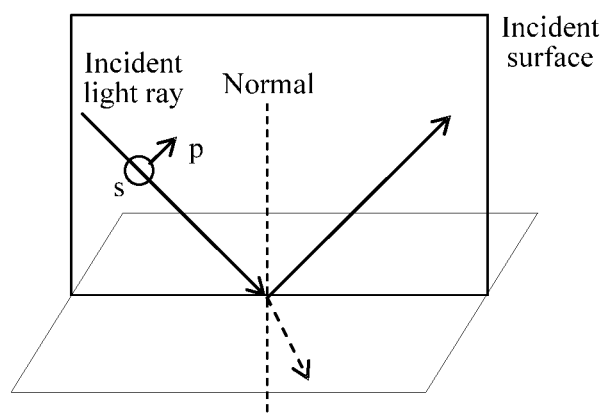
FIG. 3 is a schematic diagram of a manner for determining an incident surface according to an embodiment of the present invention.

As shown in FIG. 3, FIG. 3 is a schematic diagram of a manner for determining an incident surface according to an embodiment of the present invention. A medium interface is a quadrangle shown in a bottom surface in FIG. 3, a normal is a black dashed line, an incident surface is a block surface determined by an incident light ray and the normal, and the incident light ray is reflected and/or refracted on the medium interface.

Reflection characteristics of an optical signal are analyzed below. Incident light obliquely output onto two different homogeneous medium interfaces may be split into a vibration component perpendicular to an incident surface (that is, an s component) and a vibration component parallel to the incident surface (that is, a p component). Reflection coefficients of the two components are respectively:

the s component:

$$r_\perp = \frac{n_i \cos\theta_i - n_t \cos\theta_t}{n_i \cos\theta_i + n_t \cos\theta_t},$$

and the p component:

$$r_{//} = \frac{n_i \cos\theta_t - n_t \cos\theta_i}{n_i \cos\theta_t + n_t \cos\theta_i},$$

where $n_i$ is a refractive index of an incident medium, $\theta_i$ is an incidence angle, $n_t$ is a refractive index of a refractive medium, and $\theta_t$ is a refractive angle. In the foregoing formula, $\perp$ represents a perpendicular component, $r_\perp$ represents a reflective index of the vibration component s perpendicular to the incident surface, $\|$ represents a parallel component, and $r_\|$ represents a reflective index of the vibration component p parallel to the incident surface.

In actual application, a material used for the integrally formed coupling module provided in this embodiment of the present invention is a high temperature resistant polymer. The high temperature resistant polymer may be a polymer material, for example, polyetherimide (PEI), which has a refractive index of 1.64 in the case of a wavelength of 850 nanometers (nm). A refractive index of air is 1 herein. Change of reflection coefficients of two components of incident light on an interface along with an incidence angle is shown in FIG. 4-*a* and FIG. 4-*b*. It can be easily seen from FIG. 4-*a* and FIG. 4-*b* that, regardless of whether a light ray is output from the PEI to air or is output from air to the PEI, on the interface, the reflective index of the s component is always greater than the reflective index of the p component.

As shown in FIG. 5-a, FIG. 5-a is a schematic diagram of optical signal transmission analysis in an integrally formed coupling module in the prior art according to an embodiment of the present invention. FIG. 5-a analyzes in detail optical signal transmission in an integrally formed coupling module shown in FIG. 1. In the prior art, an incident surface of the surface ABCD is parallel to that of the surface EFGH. In this way, a direction of an s component of the incident surface of the surface ABCD is the same as a direction of an s component of the incident surface of the surface EFGH, and a direction of a p component of the incident surface of the surface ABCD is also the same as a direction of a p component of the incident surface of the surface EFGH. It can be determined from FIG. 4-a and FIG. 4-b that, reflective indexes of s components on light splitting interfaces are all greater than reflective indexes of p components. Therefore, in an output light ray, an s component of an input light ray losses energy of a larger proportion than a p component. That is, a structure formed by the surface ABCD and the surface EFGH is a polarization-sensitive structure. In FIG. 5-a, quadrangles indicated by two black blocks drawn on a surface ADHE are incident surfaces, the quadrangle indicated by the black block on the left side in FIG. 5-a is an incident surface of a medium air interface, and the quadrangle indicated by the black block on the right side in FIG. 5-a is an incident surface of an air medium interface. In FIG. 5-a, each beam of light may be split into a p component parallel to an incident surface and an s component perpendicular to the incident surface. In FIG. 5-a, an arrowed indication direction is within a screen, that is, is parallel to the incident surface, and represents the p component. Therefore, p is marked. In a circle connected by the arrow of p, a black spot exists in the circle and represents a light ray output from the screen to the outside, and the spot of the arrow represents the s component. This represents an outward direction perpendicular to the screen, that is, a direction perpendicular to the incident surface, which represents the s component. The circle represents a location of the currently analyzed light ray.

As shown in FIG. 5-b, FIG. 5-b is a schematic diagram of optical signal transmission analysis in an integrally formed coupling module according to an embodiment of the present invention. In the integrally formed coupling module shown in this embodiment of the present invention, relative locations of the surface ABCD and the surface EFGH are adjusted. In a new solution after adjustment, the incident surface of the surface ABCD is perpendicular to the incident surface of the surface EFGH. In this way, the direction of the s component of the surface ABCD is the same as the direction of the p component of the surface EFGH, and the direction of the p component of the surface ABCD is the same as the direction of the s component of the surface EFGH. In this way, the s component having a relatively large reflective index on the surface ABCD becomes the p component having a relatively small reflective index on the surface EFGH, and the p component having a relatively small reflective index on the surface ABCD becomes the s component having a relatively large reflective index on the surface EFGH. Therefore, for an output light ray, an incidence angle of the surface ABCD and an incidence angle of the surface EFGH may be appropriately selected, so that an s component and a p component of an input light ray lose energy of a same proportion. If the s and p components lose different energy, polarized noise is introduced. As the s component and the p component of the input light ray are made to lose the same energy, the polarized noise can be eliminated. A quadrangle indicated by a black block drawn on the surface ADHE in FIG. 5-b is the incident surface of the surface EFGH, and a quadrangle indicated by a black block drawn on the surface CDHG in FIG. 5-b is the incident surface of the surface ABCD. In FIG. 5-b, each beam of light may be split into a p component parallel to an incident surface and an s component perpendicular to the incident surface. In FIG. 5-b, an arrowed indication direction is within a screen, that is, is parallel to the incident surface, and represents the p component. Therefore, p is marked. In a circle connected by the arrow of p, a black spot exists in the circle and represents a light ray output from the screen to the outside, and the spot of the arrow represents the s component. This represents an outward direction perpendicular to the screen, that is, a direction perpendicular to the incident surface, which represents the s component. The circle represents a location of the currently analyzed light ray. Therefore, the s component having a relatively large reflective index on the surface ABCD becomes the p component having a relatively small reflective index on the surface EFGH, and the p component having a relatively small reflective index on the surface ABCD becomes the s component having a relatively large reflective index on the surface EFG. When an incidence angle of the surface EFGH is equal to a refractive angle of the surface ABCD, after passing through the surface ABCD and the surface EFGH, an s component and a p component of an input light ray may be made to lose energy of a same proportion. Therefore, a structure formed by the surface ABCD and the surface EFGH that are provided in this embodiment of the present invention is a polarization-insensitive structure.

It should be noted that in some embodiments of the present invention, the laser may be specifically a VCSEL, and certainly, may be a light emitting device of another type, for example, a laser diode, a light-emitting diode, or a distributed feedback laser (DFB), which is not limited herein.

In some embodiments of the present invention, the integrally formed coupling module further includes: a collimation lens, where the collimation lens is configured to collimate the first optical signal emitted by the laser and output the collimated first optical signal to the total internal reflective surface. The optical signal emitted by the laser may be collimated by using the collimation lens in the integrally formed coupling module, so that the first optical signal is straightly output to the total internal reflective surface.

In some embodiments of the present invention, the integrally formed coupling module further includes: a convergence lens, where the convergence lens is configured to converge the fourth optical signal formed after the air medium interface performs refraction and output the converged fourth optical signal to the optical fiber. The optical signal emitted from an air gap may be converged by using the convergence lens in the integrally formed coupling module, so that the fourth optical signal can be output to the optical fiber in a more concentrated manner.

In some embodiments of the present invention, the medium air interface is further configured to reflect the second optical signal, to form a fifth optical signal; and the fifth optical signal is output to an optical monitor, and the optical monitor monitors, according to the fifth optical signal, optical signal power at which the laser emits the first optical signal.

In some embodiments of the present invention, the air medium interface is further configured to reflect the third optical signal, to form a sixth optical signal; and the sixth optical signal is output to an optical monitor, and the optical monitor monitors, according to the sixth optical signal, optical signal power at which the laser emits the first optical signal.

That is, the optical monitor in this embodiment of the present invention may monitor reflected light of the medium air interface, to monitor power or a wavelength of an incident optical signal. Alternatively, the optical monitor may monitor reflected light of the air medium interface, to monitor power or a wavelength of an incident optical signal. A specific implementation manner is not limited herein. In the foregoing embodiment of the present invention, the optical monitor may be specifically a monitor photodiode (MPD), or a monitor device for an optical signal may be another optical power analysis device, which is not limited herein. For example, because the integrally formed coupling module provided in this embodiment of the present invention has no polarization-sensitive characteristic, a ratio of optical power of the fifth optical signal reflected from the medium air interface to optical power of the third optical signal refracted from the medium air interface is fixed. For example, a ratio relationship is 5%:95%. If the optical monitor obtains that power of light that accounts for the part of 5% is a, power of light that accounts for the part of 95% is (95/5)a=19a. For another example, because the integrally formed coupling module provided in this embodiment of the present invention has no polarization-sensitive characteristic, a ratio of optical power of the sixth optical signal reflected from the air medium interface to optical power of the fourth optical signal refracted from the air medium interface is fixed. For example, a ratio relationship is 5%:95%. If the optical monitor obtains that power of light that accounts for the part of 5% is a, power of light that accounts for the part of 95% is (95/5)a=19a.

In some embodiments of the present invention, the laser and/or the optical monitor is surface-mounted on a printed circuit board (PCB). The laser and/or the optical monitor may be adhered to a substrate, for example, a PCB board, in a surface-mounting manner. Specific locations of the laser and the optical monitor on the PCB and relative locations of the integrally formed coupling module provided in this embodiment of the present invention and the PCB may be determined according to a specific application scenario and are not limited herein. For example, the integrally formed coupling module and the optical fiber are in a same horizontal direction, and the first optical signal emitted by the laser is vertically output to the total internal reflective surface.

In some embodiments of the present invention, the optical signal output from the integrally formed coupling module is output to the optical fiber, and the optical fiber may be a multi-mode fiber or a single-mode fiber and is specifically determined according to an application scenario. In addition, an optical fiber interface may be a Lucent connector LC). If the interface is fixed, the interface may be implemented by using an active optical cable (AOC).

In some embodiments of the present invention, a material used for the integrally formed coupling module is a high temperature resistant polymer material, such as PEI, polyimide, or polysulfone.

It may be known according to the description of the present invention in the foregoing embodiment that, an integrally formed coupling module includes: a total internal reflective surface, a medium air interface, and an air medium interface. The total internal reflective surface reflects a first optical signal emitted by a laser to form a second optical signal, the second optical signal is output to the medium air interface, the medium air interface refracts the second optical signal to form a third optical signal, the third optical signal is output from air to the air medium interface, the air medium interface refracts the third optical signal to form a fourth optical signal, and the fourth optical signal is output to an optical fiber. Spatial locations of the total internal reflective surface, the medium air interface, and the air medium interface satisfy the following relationship: a refractive angle at which the medium air interface performs refraction to form the third optical signal is equal to an incidence angle at which the third optical signal is output to the air medium interface, and a first incident surface and a second incident surface are mutually perpendicular in space. The first incident surface is an incident surface formed by the second optical signal output to the medium air interface and a normal of the medium air interface, and the second incident surface is an incident surface formed by the third optical signal output to the air medium interface and a normal of the air medium interface. Because the first incident surface corresponding to the medium air interface and the second incident surface corresponding to the air medium interface are mutually perpendicular in space, a direction of polarized noise introduced by the medium air interface is opposite to that of polarized noise introduced by the air medium interface. Besides, in this embodiment of the present invention, the refractive angle at which the medium air interface performs refraction to form the third optical signal is equal to the incidence angle at which the third optical signal is output to the air medium interface. In this way, the polarized noise introduced by the medium air interface can completely offset the polarized noise introduced by the air medium interface, so that no polarized noise is introduced into the optical signal after the optical signal passes through the medium air interface and the air medium interface in the integrally formed coupling module provided in this embodiment of the present invention. In this embodiment of the present invention, the medium air interface and the air medium interface form a polarization-insensitive structure. Therefore, the integrally formed coupling module provided in this embodiment of the present invention has a higher data transmission rate and a longer transmission link length when transmitting an optical signal on a transmission link.

To better understand and implement the foregoing solution of the embodiments of the present invention, specific description is provided below by using a corresponding application scenario as an example.

In an embodiment of the present invention, a process of transmitting an optical signal in an integrally formed coupling module is as follows:

Step 1: A laser emits a first optical signal.

Step 2: The first optical signal is reflected on a total internal reflective surface, to form a second optical signal.

Step 3: The second optical signal is output to a medium air interface, and the second optical signal is refracted on the medium air interface, to form a third optical signal.

Step 4: The third optical signal is output to an air medium interface, the third optical signal is refracted on the air medium interface, to form a fourth optical signal, and the fourth optical signal is output to an optical fiber.

Step 5: The third optical signal is reflected on the air medium interface, to form a fifth optical signal, the fifth optical signal is output to an optical monitor, and the optical monitor monitors, according to the fifth optical signal, optical signal power at which the laser emits the first optical signal.

Step 4 and step 5 may be performed at the same time.

Figure 7:
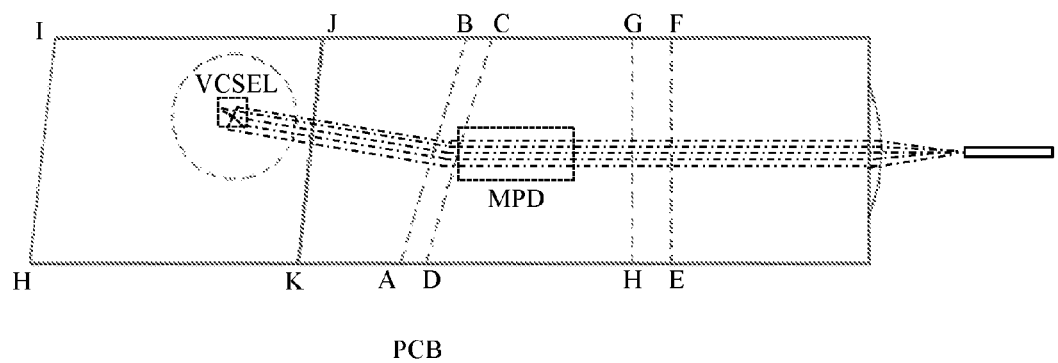
FIG. 7 is a top view of an integrally formed coupling module according to an embodiment of the present invention.
Figure 8:
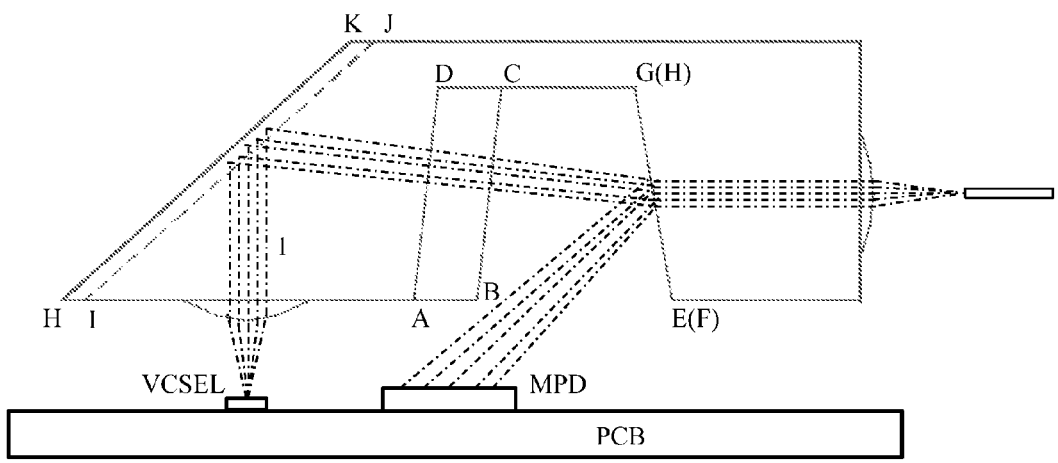
FIG. 8 is a side view of an integrally formed coupling module according to an embodiment of the present invention.

As shown in FIG. 6, FIG. 6 is a three-dimensional structural diagram of an integrally formed coupling module according to an embodiment of the present invention. As shown in FIG. 7, FIG. 7 is a top view of an integrally formed coupling module according to an embodiment of the present invention. As shown in FIG. 8, FIG. 8 is a side view of an integrally formed coupling module according to an embodiment of the present invention. In this embodiment of the present invention, vertical upward light emitted by a VCSEL surface-mounted on a PCB is coupled to a horizontally placed multi-mode fiber. In addition, a MPD surface-mounted on the PCB board needs to monitor in real time power of the light emitted from the VCSEL. The integrally formed coupling module provided in this embodiment of the present invention does not introduce extra mode noise or polarized noise into an output optical signal.

In this embodiment of the present invention, a surface HIJK used as a TIR surface is adjusted, and spatial locations of the adjusted surface HIJK and a surface ABCD enable that an incident surface formed by a light ray 2 and the surface ABCD is perpendicular to an incident surface formed by a light ray 3 and a normal of a surface EFGH, where a light ray 1 is formed after vertical upward divergent light emitted by the VCSEL is collimated by a collimation lens, the light ray 2 is formed after the light ray 1 is reflected by the TIR surface, and the light ray 3 is formed after the light ray 2 is refracted. A light ray 4 refracted from the surface EFGH is horizontally output and converged by a convergence lens, and then coupled to the multi-mode fiber, and a light ray 5 reflected from the surface EFGH is used to monitor power. In this embodiment of the present invention, a structure formed by the surface ABCD and the surface EFGH is a polarization-insensitive structure. Therefore, after passing through the integrally formed coupling module, no extra mode noise or polarized noise is introduced into an output light ray 6.

That the integrally formed coupling module in this embodiment of the present invention is a polarization-insensitive device and does not introduce polarized noise is analyzed in the following. Light reflection and refraction of a medium air interface and an air medium interface at two ends of an air gap are polarization-sensitive. However, the medium air interface and the air medium interface in this embodiment of the present invention may be appropriately adjusted so that incident surfaces of the two interfaces are mutually perpendicular. In this way, polarization characteristics of the two interfaces may be mutually compensatory. Finally, the entire module is polarization-insensitive and does not introduce polarized noise to an optical signal passing through the module.

That the integrally formed coupling module in this embodiment of the present invention does not introduce mode noise is analyzed in the following. The medium air interface and the air medium interface at the two ends of the air gap have a same reflective index and refractive index with respect to all modes included in a light beam, where the modes refer to properties of light spots emitted from the laser. That is, when an optical signal passes through the interfaces, only overall optical power changes, and mode distribution and combination therein remain unchanged. Therefore, the module does not introduce mode noise to an optical signal passing through the module. However, a spatial light splitting solution in the prior art not only changes optical power but also changes mode distribution and combination of a light beam, which introduces mode noise.

The integrally formed coupling module provided in this embodiment of the present invention has a feature of low costs. The integrally formed coupling module not only omits process steps of multiple times of coupling and alignment of a TO process, but also omits multiple discrete materials involved in the TO process. Therefore, the module has low costs.

In addition, it should be noted that the described apparatus embodiment is merely exemplary. The units described as separate parts may or may not be physically separate, and parts displayed as units may or may not be physical units, may be located in one position, or may be distributed on a plurality of network units. Some or all of the modules may be selected according to actual needs to achieve the objectives of the solutions of the embodiments. In addition, in the accompanying drawings of the apparatus embodiments provided by the present invention, connection relationships between modules indicate that the modules have communication connections with each other, which may be specifically implemented as one or more communications buses or signal cables. A person of ordinary skill in the art may understand and implement the embodiments of the present invention without creative efforts.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. An integrally formed coupling module, wherein the integrally formed coupling module comprises a total internal reflective surface, a medium air interface, and an air medium interface, wherein:
the total internal reflective surface is configured to reflect a first optical signal emitted by a laser to form a second optical signal, and the second optical signal is output to the medium air interface;
the medium air interface is configured to refract the second optical signal to form a third optical signal, and the third optical signal is output from air to the air medium interface;
the air medium interface is configured to refract the third optical signal to form a fourth optical signal, and the fourth optical signal is output to an optical fiber; and
spatial locations of the total internal reflective surface, the medium air interface, and the air medium interface satisfy the following relationship: a refractive angle at which the medium air interface performs refraction to form the third optical signal is equal to an incidence angle at which the third optical signal is output to the air medium interface, and a first incident surface and a second incident surface are mutually perpendicular in space so that a first polarized noise introduced by the medium air interface offsets a second polarized noise introduced by the air medium interface so that the first polarized noise and the second polarized noise are not introduced into the fourth optical signal, wherein
the first incident surface is an incident surface formed by the second optical signal output to the medium air interface and a normal of the medium air interface, and the second incident surface is an incident surface formed by the third optical signal output to the air medium interface and a normal of the air medium interface.

2. The module according to claim 1, wherein:
the medium air interface is further configured to reflect the second optical signal, to form a fifth optical signal; and
the fifth optical signal is output to an optical monitor, and the optical monitor monitors, according to the fifth optical signal, optical signal power at which the laser emits the first optical signal.

3. The module according to claim 1, wherein:
the air medium interface is further configured to reflect the third optical signal, to form a sixth optical signal; and
the sixth optical signal is output to an optical monitor, and the optical monitor monitors, according to the sixth optical signal, optical signal power at which the laser emits the first optical signal.

4. The module according to claim 1, wherein the laser and/or an optical monitor is surface-mounted on a printed circuit board (PCB).

5. The module according to claim 1, wherein:
the integrally formed coupling module further comprises a collimation lens; and
the collimation lens is configured to collimate the first optical signal emitted by the laser and output the collimated first optical signal to the total internal reflective surface.

6. The module according to claim 1, wherein:
the integrally formed coupling module further comprises a convergence lens; and
the convergence lens is configured to converge the fourth optical signal formed after the air medium interface performs refraction and output the converged fourth optical signal to the optical fiber.

7. The module according to claim 1, wherein a material used for the integrally formed coupling module is a high temperature resistant polymer.

8. The module according to claim 1, wherein the optical fiber is a multi-mode fiber.

9. The module according to claim 1, wherein the optical fiber is a single-mode fiber.

10. The module according to claim 1, wherein the integrally formed coupling module and the optical fiber are in a same horizontal direction, and the first optical signal emitted by the laser is vertically output to the total internal reflective surface.

11. The module according to claim 4, wherein the optical monitor is specifically a monitor photodiode (MPD).

12. The module according to claim 1, wherein the laser is specifically a vertical cavity surface-emitting laser (VCSEL).

13. The module according to claim 1, wherein the laser is specifically a distributed feedback laser (DFB).

14. The module according to claim 1, wherein spatial locations of the total internal reflective surface, the medium air interface, and the air medium interface further satisfy the following relationship: a surface connecting the first incident surface and the second incident surface is mutually perpendicular in space to the first incident surface.

15. The module according to claim 1, wherein spatial locations of the total internal reflective surface, the medium air interface, and the air medium interface further satisfy the following relationship: a top surface connecting the first incident surface and the second incident surface is mutually perpendicular in space to the first incident surface; and a side surface connecting the first incident surface and the second incident surface have an acute angle or an obtuse angle.

* * * * *